(12) United States Patent
Ball

(10) Patent No.: US 6,426,564 B1
(45) Date of Patent: Jul. 30, 2002

(54) RECESSED TAPE AND METHOD FOR FORMING A BGA ASSEMBLY

(75) Inventor: Michael Ball, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/256,867

(22) Filed: Feb. 24, 1999

(51) Int. Cl.⁷ .................. H01L 29/40; H01L 21/44; H01L 31/26; H01L 21/46; H01L 21/301

(52) U.S. Cl. .................. 257/783; 257/780; 257/753; 257/779; 257/738; 438/612; 438/15; 438/458; 438/462; 438/613; 438/106

(58) Field of Search .................. 438/612, 15, 458, 438/462, 613, 106; 257/780, 753, 779, 738, 783

(56) References Cited

U.S. PATENT DOCUMENTS

| | | | |
|---|---|---|---|
| 3,320,658 A | 5/1967 | Bolda et al. | 29/155.5 |
| 3,396,894 A | 8/1968 | Ellis | 228/56 |
| 3,719,981 A * | 3/1973 | Steitz | 29/423 |
| 3,744,129 A | 7/1973 | Dewey, Jr. | 29/624 |
| 3,982,320 A | 9/1976 | Buchoff et al. | 29/630 |
| 4,664,309 A | 5/1987 | Allen et al. | 228/180 |
| 4,668,761 A * | 5/1987 | Aoshima et al. | 528/230 |
| 4,705,205 A | 11/1987 | Allen et al. | 228/180 |
| 4,712,721 A | 12/1987 | Noel et al. | 228/56.3 |
| 4,802,276 A | 2/1989 | Bowcutt et al. | 29/739 |
| 4,903,889 A | 2/1990 | Svendsen et al. | 228/180 |
| 4,996,587 A * | 2/1991 | Hinrichsmeyer et al. | 357/74 |
| 5,089,314 A * | 2/1992 | Masujima | 428/156 |
| 5,194,930 A * | 3/1993 | Papthomas et al. | 257/773 |
| 5,219,117 A * | 6/1993 | Lin | 228/253 |
| 5,385,291 A | 1/1995 | Latta | 228/180.22 |
| 5,431,332 A | 7/1995 | Kirby et al. | 228/246 |
| 5,442,852 A | 8/1995 | Danner | 29/843 |
| 5,462,743 A * | 10/1995 | Turner et al. | 424/448 |
| 5,482,736 A | 1/1996 | Glenn et al. | 427/96 |
| 5,497,938 A * | 3/1996 | Mcmahon | 228/253 |
| 5,617,990 A | 4/1997 | Thompson, Sr. | 228/180 |
| 5,658,827 A | 8/1997 | Aulicino et al. | 228/180 |
| 5,685,477 A | 11/1997 | Mallik et al. | 228/254 |
| 5,704,536 A | 1/1998 | Chen et al. | 228/41 |
| 5,716,222 A | 2/1998 | Murphy | 429/91 |
| 5,736,456 A | 4/1998 | Akram | 438/614 |
| 5,783,461 A | 7/1998 | Hembree | 438/17 |
| 5,796,590 A | 8/1998 | Klein | 361/774 |
| 5,861,323 A | 1/1999 | Hayes | 438/111 |
| 5,890,915 A * | 4/1999 | Reylek | 439/91 |
| 5,917,700 A * | 6/1999 | Clemens et al. | 361/704 |

FOREIGN PATENT DOCUMENTS

| | | | |
|---|---|---|---|
| JP | 01037367 A | * | 2/1989 |
| JP | 01099911 A | * | 4/1989 |
| JP | 08083819 A | * | 3/1996 |
| JP | 09-183485 | * | 7/1997 |
| JP | 2000072108 A | * | 3/2000 |

OTHER PUBLICATIONS

Akiyama, 1989 IEEE vol. 25 Issue 5, "Contiuous Formation of CoCr films on PEN tape . . . ".*

* cited by examiner

Primary Examiner—David E. Graybill
Assistant Examiner—James Mitchell
(74) Attorney, Agent, or Firm—Schwegman, Lundberg, Woessner & Kluth, P.A.

(57) ABSTRACT

A system for attaching a plurality of solder balls to an electronic device is disclosed. The system includes, in one embodiment, a heat-resistant tape having a first side comprising a plurality of recesses. The first side of the tape may form an adhesive surface. The recesses are located for registration with a plurality of connection points on the electronic device. The recesses are each adapted to receive and retain a solder ball therein. After placing a solder ball within two or more of the recesses, the first side of the tape may be adhered to the electronic device with the solder balls retained therein. Heating of the solder balls causes them to reflow and adhere to the connection points. After cooling, the tape may be removed, wherein the solder balls remain bonded to the connection points, forming a Ball Grid Array (BGA).

43 Claims, 6 Drawing Sheets

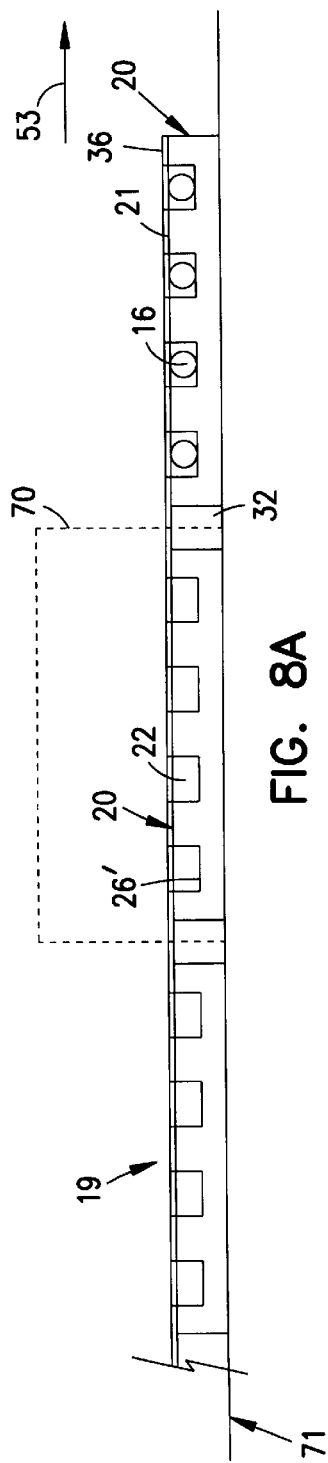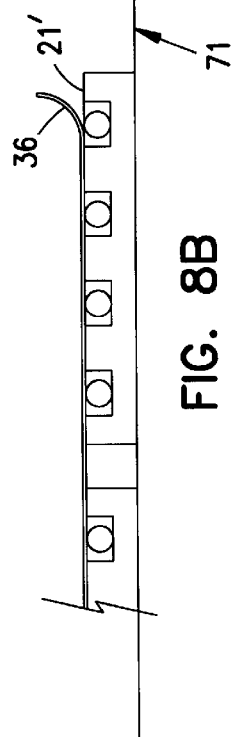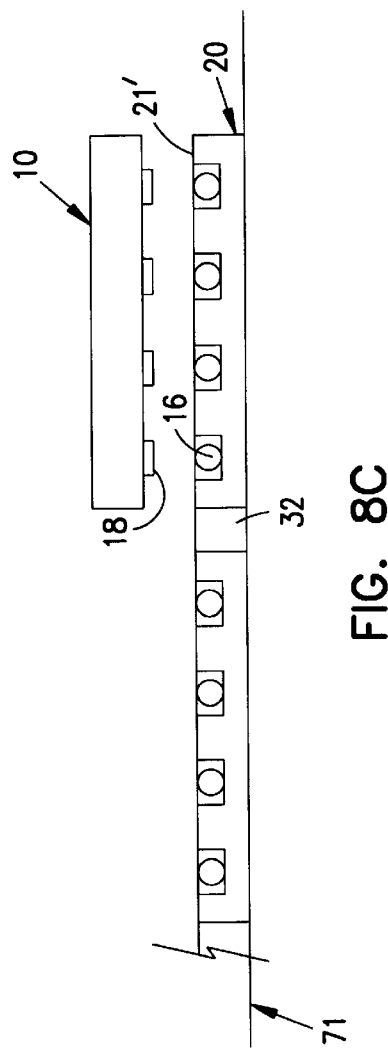

RECESSED TAPE AND METHOD FOR FORMING A BGA ASSEMBLY

TECHNICAL FIELD

This invention relates generally to semiconductor fabrication and, more specifically, to a system for accurately positioning and securing solder balls to a semiconductor device to form a Ball Grid Array (BGA) thereon.

BACKGROUND OF THE INVENTION

As demand for smaller, more powerful electronic devices grows, semiconductor manufacturers are constantly attempting to reduce the size and cost of semiconductor packaging. Smaller packages equate with higher semiconductor mounting densities and higher mounting densities allow for more capable yet more compact devices.

With conventional packaging methods, a semiconductor die or "chip" is encapsulated in a ceramic or plastic package having a number of electrical leads extending therefrom. The leads permit electrical connection between external components and the circuits on the die. Although these packages have proven reliable, they are generally many times larger than the actual die. In addition, the configuration of these packages typically yields only a limited number of leads. For these reasons, conventional packaging techniques are not particularly adaptable to miniaturization.

As a result, recent developments in semiconductor packaging have led to more efficient chip packages. For example, "pin grid arrays" or PGAs utilize a series of pins extending from an entire face of the die (or other electronic device). The pins are electrically connected by traces or bond wires to the electrical circuits on the die. Electrical interconnection is produced by inserting the array of pins into mating sockets on a receiving component. While PGAs provide increased electrical interconnection density, the pins forming the PGA are fragile and easily bent. In addition, the PGA is relatively expensive to produce.

Similar to the PGA is the "ball grid array" or BGA. Instead of pins, the BGA has an array of solder bumps or balls attached to one side of the semiconductor device. The array of solder bumps is adapted to mate with a receiving component wherein the package may be subsequently heated to partially liquefy or "reflow" the bumps, thus forming electrical connections at the discreet ball locations. Like the PGA, the BGA improves conductor density by utilizing the entire device face for electrical interconnection. The present invention is directed primarily to BGAs and the remainder of this discussion will focus on the same.

While BGAs have proven reliable, there are known problems. Primarily, current procedures used to attach the solder balls are expensive or otherwise not conducive to high volume, low cost manufacturing. For instance, one method of solder ball attachment involves an automated robotic arm that picks up individual solder balls, applies a flux thereto, and precisely places the balls at the correct locations on the device. Heat is then applied to reflow the solder balls and thus secure the balls to the device. While effective, this method requires highly specialized and expensive machinery. Furthermore, the machine must be reconfigured for each BGA pattern.

Another method for locating and attaching solder balls to form a BGA uses a fixture having a stencil or silk screen overlay with a series of apertures corresponding to the desired ball locations or bond pads on the device. After the stencil is brought into registration with the electronic device, flux is applied through the apertures to coat the bond pads. A solder paste is then squeegeed over the stencil, filling the apertures. Due to the relative viscosities of the flux and paste, the paste adheres temporarily to the flux-covered bond pads. To avoid adhesion to the stencil, it is typically made from a non-wettable material. The stencil is then removed and the assembly is heated to reflow the solder paste wherein the paste forms a solder ball at each location. Alternatively, the stencil may remain until after reflow.

Like the robotic machines, solder paste techniques are not without problems. One particular problem with solder paste is that ball placement density or "pitch" is limited by the viscosity of the solder paste. In particular, the paste can flow outwardly from its intended bond pad once the stencil is removed. In addition, fine pitch stencils can accommodate only limited solder volume, restricting the size of the resulting ball. Furthermore, the process of applying the solder paste to the stencil is time consuming and difficult to completely and efficiently automate.

A variation of the paste method involves placing solder balls instead of solder paste into the stencil. Here, the electronic device and the stencil may be placed into an alignment fixture. A plurality of solder balls may then be placed over the stencil. By agitating the fixture, the solder balls "drop into" the apertures and are temporarily retained in the layer of flux on each bond pad. Like the solder paste techniques described above, the balls may be reflowed to attach to the bond pads. Unfortunately, this method of attachment is also time consuming and difficult to automate.

Yet another method of solder ball placement uses a flexible carrier or preform having embedded solder balls therein. With the assistance of an alignment fixture, the preform is brought into edge registration with the electronic device. The preform may then be reflowed to secure the embedded solder balls to the device. While effective in overcoming some of the stencil problems, removal of the carrier requires an aqueous rinse or manual removal procedures. For this and other various reasons, the preform attachment method is used primarily in low volume applications.

Another method of solder ball placement is described in U.S. Pat. No. 5,861,323 issued to Hayes on Jan. 19, 1999. Hayes describes a insulating membrane holding an array of solder balls wherein the solder balls protrude through both sides of the membrane. The membrane is then precisely placed between two components and the solder reflowed. While effective, Hayes requires that the membrane and both electronic components be held in precise alignment during reflow. Furthermore, the membrane remains in place between the two components after solder reflow.

Still yet another method of solder ball placement is shown in U.S. Pat. No. 5,219,117 issued to Lin on Jun. 15, 1993. Lin discloses a transfer substrate having a plurality of recesses which align with bond pads on a semiconductor device. While overcoming some of the problems with the other attachment techniques, the transfer substrate does not positively retain the solder balls after insertion into the recesses. Accordingly, the substrate must be carefully handled prior to reflow to prevent dislodging of the balls from the substrate. Furthermore, the method described by Lin does not secure the transfer substrate to the semiconductor device prior to reflow. As such, the substrate and device must be held in precise alignment by external means during reflow.

Accordingly, what is needed is a system of locating and securing solder balls in a manner that is conducive to high volume BGA production. What is further needed is a system which can economically and reliably position the solder balls on a high density (fine pitch) semiconductor device and secure the balls thereto until subsequent reflow.

SUMMARY OF THE INVENTION

A heat-resistant tape and method of using the tape to locate and secure a plurality of solder balls to an electronic component is described herein. The method comprises providing a heat-resistant tape having a first side with an adhesive coating applied to the first side to form a first adhesive surface. The tape also has a plurality of blind recesses formed on the first side wherein each blind recess has a second adhesive surface therein. A solder ball is placed into two or more of the blind recesses wherein the solder balls adhere to the second adhesive surface. The first side of the tape is then secured to an electronic component having a plurality of connection points, wherein the two or more blind recesses are aligned with two or more of the connection points.

In one embodiment, the heat resistant tape comprising a first side forming a first adhesive surface, wherein a plurality of blind recesses are formed on the first side. In addition, each blind recess has a second adhesive surface adapted to retain a solder ball within the blind recess.

In another embodiment, a heat-resistant tape is described comprising a first side having a first adhesive surface adapted to adhere to the face of an electronic component. The tape further comprises a plurality of blind recesses located on the first side where each blind recess is adapted to receive a solder ball such that the solder ball does not extend beyond the first side. Each blind recess also has a second adhesive surface adapted to retain the solder ball within the blind recess.

In yet another embodiment, a heat-resistant tape for securing a plurality of solder balls to a semiconductor device is described comprising a first layer having a first side, a second side, and a plurality of perforations therebetween. Furthermore, the tape has a second layer having a first side where the first side of the second layer is laminated to the second side of the first layer such that the plurality of perforations form a plurality of blind recesses each adapted to receive and retain a solder ball therein.

In still yet another embodiment, a pre-assembled BGA assembly is described comprising a semiconductor device having a face defining a series of electrical connection points. The pre-assembled BGA assembly further includes a tape segment having a first side secured to the face of the semiconductor device where the first side of the tape segment comprises a plurality of blind recesses generally aligned with the series of electrical connection points. Located within each blind recess is a solder ball in close proximity to the electrical connection point.

Advantageously, the present invention provides an efficient and reliable tape for producing BGA assemblies in high volume. By patterning the tape to match the specific array of bond pads, the present invention also provides an accurate method of placing a plurality of solder balls relative to a semiconductor device to form most any BGA configuration including fine pitch grids. Furthermore, the tape and method described herein avoid the problems of stencil/solder paste and other conventional placement techniques. The tape also provides a convenient way to secure the solder balls to the tape and the tape to the semiconductor device.

BRIEF DESCRIPTION OF THE DRAWINGS

The invention described herein will be further characterized with reference to the drawings, wherein:

FIGS. 8A–8F are schematic side elevation views illustrating the steps for attaching solder balls to form a BGA in accordance with one embodiment of the present invention.

DETAILED DESCRIPTION OF THE EMBODIMENTS

In the following detailed description, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

The invention is generally directed to an improved system for locating and attaching solder balls to an electronic assembly or component such as a semiconductor device to form a ball grid array (BGA) thereon. The system comprises a tape having a first side which includes a plurality of blind recesses adapted to receive a solder ball therein. After filling the recesses, the first side of the tape may be secured to the electronic component wherein the plurality of recesses are in registration with a plurality of connection points on the component. The solder balls may then be heated until they reflow and attach to the connection points. Due to the surface tension characteristics of conventional solder materials, the balls remain spherical and tend to center on the connection points when heated. Once the solder balls are secured, the tape may be removed from the component, leaving it with the BGA formed thereon. Accordingly, the present invention provides a system for placing and securing solder balls wherein the system is adaptable to high volume production.

Figure 1:
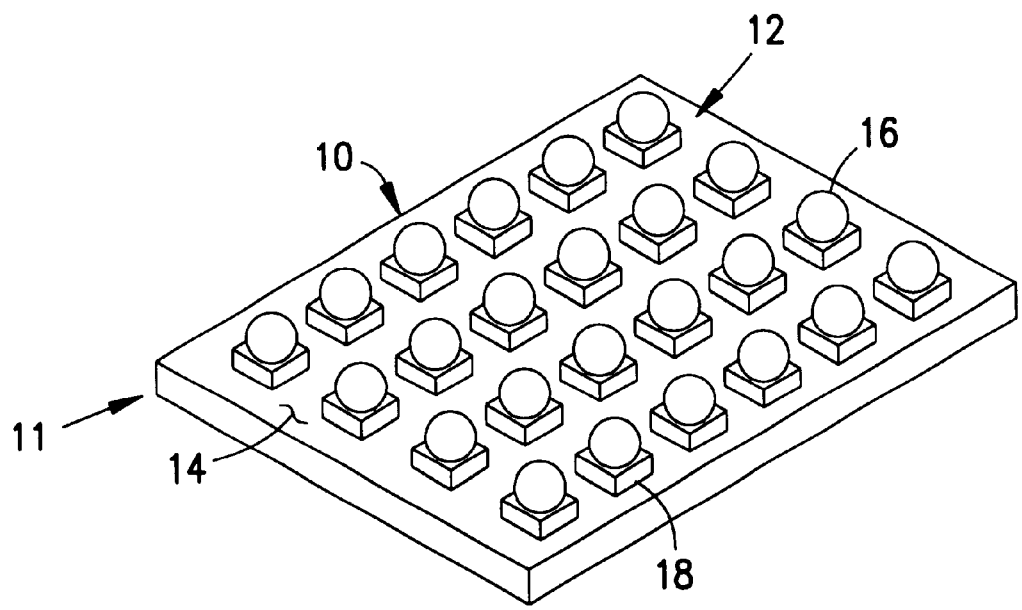
FIG. 1 is an perspective view of an BGA assembly comprising a semiconductor device having a BGA formed thereon in accordance with one embodiment of the invention.

With this brief introduction, various embodiments of the invention will now be described with reference to the figures. Referring first to FIG. 1, an electronic component 10 according to one exemplary embodiment of the invention is shown. Attached to a face 14 of the component is a BGA 12. The BGA 12 is formed by the attachment of solder balls 16 to discreet connection points or bond pads 18 on the face 14. The bond pads are positioned in a particular array to effect efficient connection to the circuits on the face of the component 10. The pads 18 may be flush or alternatively protrude from the face 14 as shown. Once attached, the device 10 and solder balls 16 form a BGA assembly 11.

Figure 2:
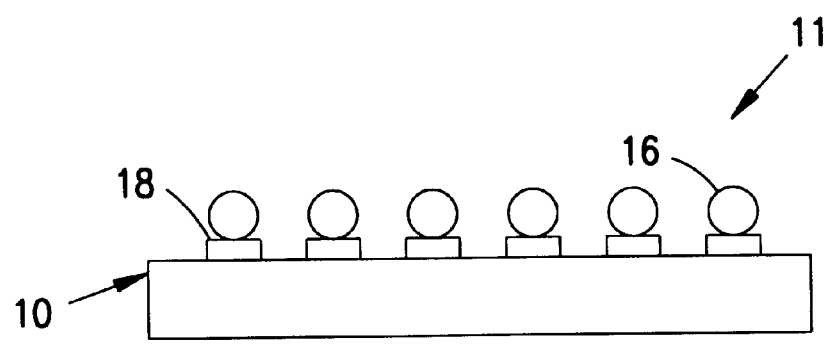
FIG. 2 is a side view of the BGA assembly of FIG. 1.
Figure 3:
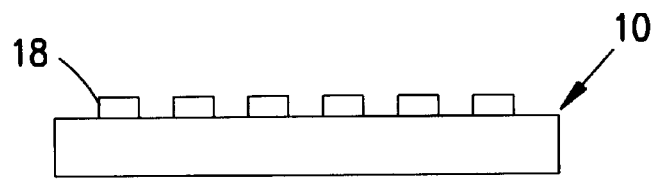
FIG. 3 is side view of a semiconductor die in accordance with one embodiment of the invention before attachment of the solder balls.

Referring now to FIGS. 2 and 3, side views of the BGA assembly 11 and the electronic component 10 (the latter shown prior to attachment of the solder balls 16) are respectively shown. In these figures, the bond pads 18 and the solder balls 16 are clearly illustrated. For purposes of this discussion, the electronic component will be hereinafter referred to as a semiconductor die 10. However, this invention is equally applicable to other devices that may utilize a BGA including, for example, PCB substrates and other integrated circuit (IC) devices. Furthermore, the invention is not limited to semiconductor devices or, for that matter, to electronic components in general. Rather, it may be used to locate and secure reflowable material in most any discreet pattern and on most any surface.

Figure 4:
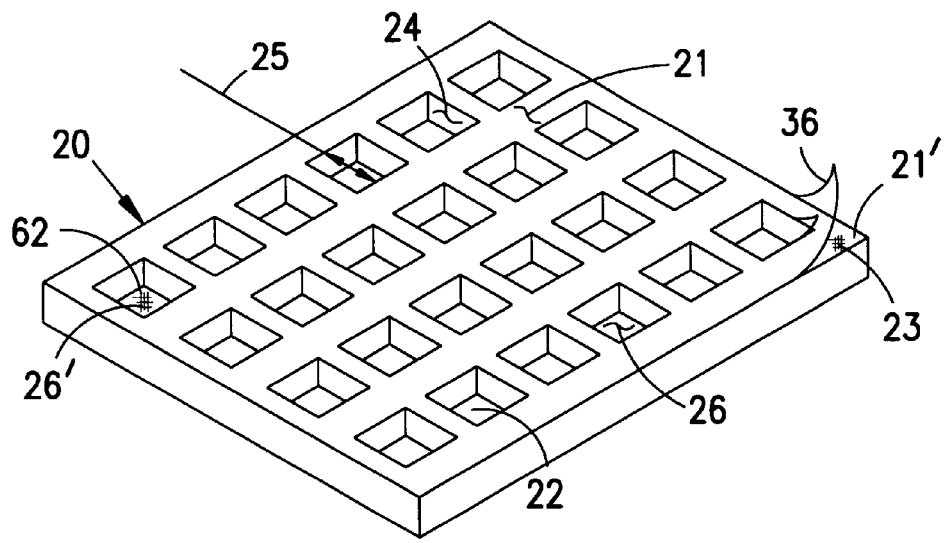
FIG. 4 is a perspective view of a tape segment in accordance with one embodiment of the invention.

FIG. 4 illustrates a heat-resistant film or tape segment 20 in accordance with one exemplary embodiment of the invention. The term "tape segment" is used herein to denote a piece or portion of tape adapted to secure a plurality of solder balls 16 to a single die 10. The tape segment 20 has a first side 21 having a plurality of pockets or blind recesses 22 each adapted to receive a solder ball 16 (not shown) therein. Each blind recess 22 has at least one interior surface. In one embodiment, one or more side surfaces 24 and one or more blind surfaces 26 define the interior surfaces of the recess. While the recesses 22 are shown generally throughout the figures as rectangular (in the plan view), other shapes (e.g., circular, triangular, conical, or other shapes) are also possible without departing from the scope of the invention. In one embodiment, each blind recess comprises four planar side surfaces 24 and one planar blind surface 26 as shown in FIG. 4. The blind surface may be located a sufficient depth below the first side 21 that a solder ball placed therein does not protrude beyond the first side 21. Alternatively, the recess depth may place the solder ball 16 so that it is flush with or protrudes slightly from the first side 21.

Referring still to FIG. 4, The tape segment is die-specific so that, if placed in registration with the die 10, one blind recess 22 corresponds precisely with one bond pad 18. The first side 21 of the tape segment 20, in one embodiment, is coated with a first adhesive 23 to permit lamination of the tape segment 20 to the die face 14. The adhesive 23 remains thermally stable even at solder reflow temperatures (i.e., the temperature necessary to cause solder materials to liquefy). That is, the adhesive 23 will not separate or "delaminate" from the die 10 during solder reflow. Nor will it burn, melt, or breakdown. For clarity, the first side 21 with the adhesive 23 applied thereto will be hereinafter referred to as the first adhesive surface 21'.

To protect the first adhesive surface 21' until lamination with the die 10, a removable liner 36 as shown in FIG. 4 may be included. The liner 36 is a thin flexible layer covering the first adhesive surface 21'. The liner has a plurality of perforations that align with the blind recesses 26. Accordingly, when the liner 36 is in place, access to the recesses is not impeded. Before the tape segment 20 is laminated to the die 10, the liner 36 may be removed, exposing the first adhesive surface 21' underneath.

Each blind recess 22 is sized to receive and retain a single solder ball 16 as further described below. Accordingly, each recess includes a recess opening 25 of sufficient size to accommodate one solder ball. The recess is located and sized to position the solder ball in close proximity to the bond pad when the tape segment 20 is secured to the die 10. However, it is not critical that the recess precisely align the ball with the center of the bond pad (i.e., the blind recess may be slightly larger than the solder ball). The reflow properties of the solder will generally cause the ball to centrally attach to the bond pad. In one embodiment, the blind recess 22 includes another adhesive coating 62 (discussed in more detail below) applied to one or more of the interior surfaces 24, 26 to form a second adhesive surface. In one embodiment, the adhesive coating is located on the surface 26 such that the blind surface 26 forms the second adhesive surface. To simplify the remaining discussion, the blind surface 26 with the adhesive 62 will be denoted the second adhesive surface 26'. The second adhesive surface 26' adhesively retains each solder ball 16 in its respective blind recess 22.

While the tape segment 20 may be comprised of various materials, it is, in one embodiment, made from one or more layers of polyimide film. Polyimide film is available under various trade names such as UPILEX® (commercially available from UBE Industries Ltd) or KAPTON® (available from Dupont). Polyimide film is able to withstand thermal processing temperatures in excess of those required for conventional solder reflow. In addition, polyimide and the adhesive coating 23 are able to withstand the thermal stresses induced by thermal expansion mismatch between the die 10 and the tape segment 20 during reflow. Furthermore, polyimide is non-wettable (i.e., solder materials will not adhere thereto). Thus, the solder balls will not attach to the interior surfaces 24, 26 during reflow. While described herein with reference to a polyimide film, other heat-resistant materials (e.g., glass, silicon) are equally within the scope of the invention.

Figure 5:
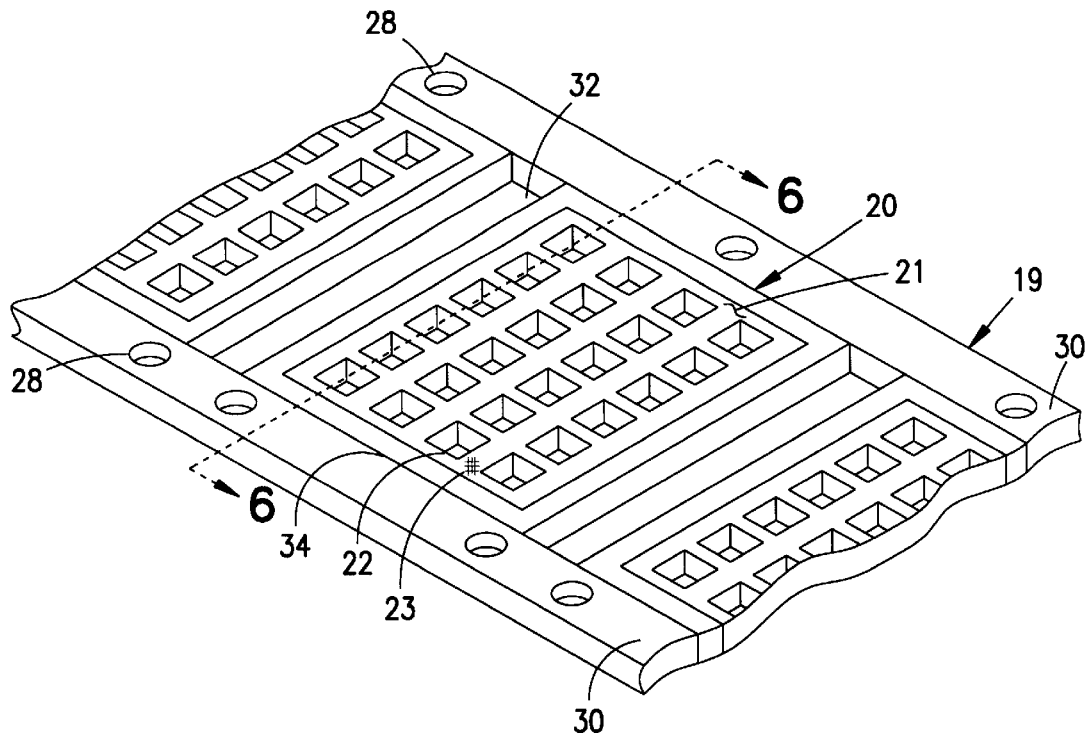
FIG. 5 is a perspective view of a sheet having a plurality of tape segments constructed in accordance with one embodiment of the invention.

The tape segment 20 may be provided in a variety of configurations and forms. For example, the tape segments may be formed individually for attachment to individual dies (see FIG. 4). Alternatively, multiple tape segments may be formed from a larger, unitary piece of tape. As an example of the latter, the tape segments 20 may be formed on a strip or sheet 19 as shown in FIG. 5 to facilitate automated assembly. The sheet 19, in one embodiment, includes side rails 30 incorporating indexing features or holes 28 that permit the sheet to be precisely located during processing. The sheet 19 is formed into a series of tape segments 20 each adapted to accommodate a single die 10. Separating each tape segment 20 is a slot 32. The slot 32, along with a pair of opposing shear lines 34, permit the tape segment 20 to be separated from the sheet 19. The tape segments may be separated at any point in the process (e.g., before or after attachment to the die 10).

Figure 6:
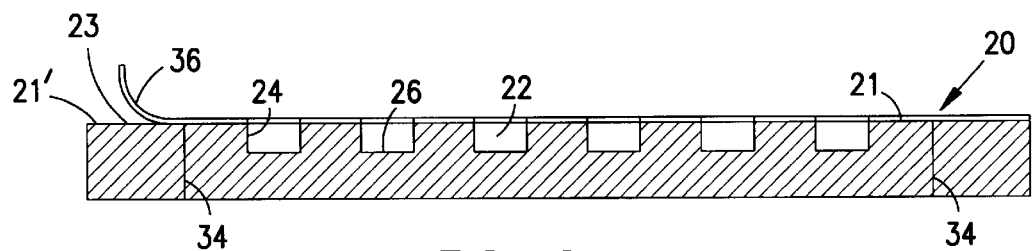
FIG. 6 is a cross sectional view of one tape segment taken along lines 6—6 of FIG. 5.
Figure 7:
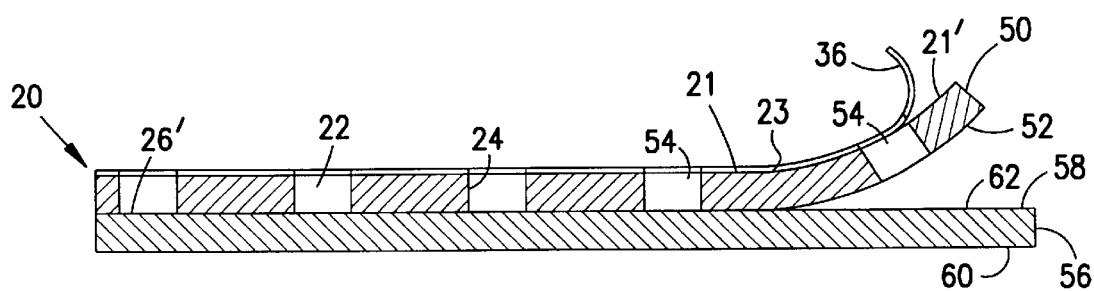
FIG. 7 is a sectional view of a tape segment constructed in accordance with another embodiment of the invention.

FIG. 6 shows a cross-sectional view of the tape segment 20. The recesses 22, including the side surfaces 24 and the blind surfaces 26, are clearly visible. While the particular construction of the tape segment 20 is not perceived to be critical, one exemplary embodiment of the tape will now be described with reference to FIG. 7. Here, the tape segment 20 comprises a laminate of two layers. A first layer 50 is defined by the first side 21 and a second side 52. The adhesive coating 23 applied to the first side 21 forms the first adhesive surface 21'. The removable liner 36 protects the first adhesive surface 21' until lamination with the die 10. A series of perforations 54 are formed through the first layer 50 and the liner 36. Like the blind recesses 22 which they ultimately form, the perforations 54 are patterned to match a specific array of bond pads 18 (see FIG. 1). The perforations may be formed in the first layer by any number of conventional techniques including, for example, punching, etching or laser cutting.

Laminated to the second side 52 of the first layer 50 is a second layer 56. Unlike the first layer 50, the second layer 56 has no perforations therein. The second layer 56 has a first side 58 which laminates to the second side 52 of the first layer 50. The two layers may be laminated by a variety of conventional methods including heat and/or pressure processes. In one embodiment, the first side 58 of the second layer 56 comprises the second adhesive coating 62 for laminating the second layer 56 to the first layer 50. Like the first adhesive coating 23, the second adhesive coating 62 will not allow separation or "delamination" of the layers during solder reflow.

When laminated, the first side 58 of the second layer 56 forms the blind surface 26 (and thus, with the adhesive coating 62, the second adhesive surface 26'). The second adhesive surface 26' secures the solder balls 16 as further described below.

Once the two layers 50, 56 are laminated, the tape segment 20 as shown in FIG. 4 is formed. Alternatively, the sheet 19 of FIG. 5 may be formed by joining a length of layers 50 and 56. Conventional tape punching processes may be used to produce features such as the indexing holes 28 and the shearing slots 32.

While discussed above with reference to a two-layer tape, other tape configurations (e.g., single layer, trilayer) are also possible without departing from the scope of the invention.

Having described various embodiments of the tape, a method of positioning and attaching the solder balls to form a BGA assembly according to one embodiment of the invention will now be described. One exemplary embodiment of the attachment method according to the invention is illustrated in FIGS. 8A–8F. While the method is described herein in a particular order, it is noted that the various procedures may be rearranged to some degree to better accommodate manufacturing processes.

With reference to FIG. 8A, the tape segment 20 is shown as incorporated into the sheet 19. To facilitate movement of the sheet in automated machinery, it may be coupled to a generic conveyor system 71 with the first side 21 facing upwards. The conveyor system may move the sheet from one location to the next along a direction 53. Alternatively, the sheet 19 may remain stationary while the various processing equipment (described below) moves relative thereto. The indexing holes 28 may be used to precisely locate the tape at various stations during processing.

As shown in FIG. 8A, the tape may first pass through ball placement apparatus 70 which deposits the solder balls 16 into the blind recesses 22. Since the ball placement apparatus 70 is not central to the invention, it is not described in detail herein. However, conventional techniques known in the art can be effectively employed to place solder balls within the recesses. For instance, in one embodiment, a container filled with solder balls is located above the conveyor 71. When the segment 20 is beneath the placement apparatus 70, solder balls are applied in quantity to the first side 21. Since the recesses are sized appropriately, one solder ball fills each recess. The liner 36 prevents the solder balls from adhering to the first adhesive surface 21'. The excess solder balls may be removed from the first side 21 through a variety of mechanical means including tilting or agitation of the tape segment 20 or forcing air across the first side.

Alternatively, the apparatus 70 may utilize a stencil fixture (not shown) having a series of apertures wherein the stencil fixture may be placed over the tape segment 20 such that the stencil apertures align with the recesses 22. The solder balls 16 may then be placed in quantity over the stencil fixture whereby a single ball falls into each aperture and fills each blind recess 22 of the tape segment 20. The excess solder balls and the stencil are then removed, leaving one solder ball in each recess.

Other techniques for placing the solder balls are also contemplated within the scope of the invention. For example, the apparatus 70 may utilize a conventional pick and place machine or other automated or manual equipment.

Regardless of the placement means used, the tape segments emerge with the blind recesses filled as shown in FIG. 8A. The second adhesive surface 26' secures each solder ball 16 in place. Conventional pattern recognition techniques may be used to determine that each recess is filled.

Figure 8D:
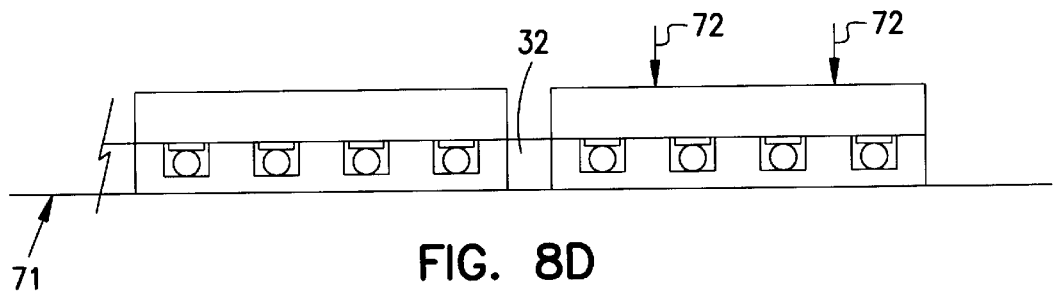

Once the tape segment 20 has received the solder balls 16, the liner 36 may be removed from the first side 21 as shown in FIG. 8B, exposing the first adhesive surface 21'. With the liner removed, the tape segment moves to a die attach station. Before attaching the die 10 to the tape segment 20, the bond pads 18 may be coated with flux to promote bonding with the solder balls 16. The die 10 is then brought into registration with the tape segment 20 as shown in FIG. 8C using conventional alignment methods (e.g., optical location, edge registration, etc). Once aligned, the die 10 is placed into contact with the tape segment 20 as shown in FIG. 8D. While illustrated with the tape below the die, the components may be flipped (the die 10 could be brought upwardly into contact with a downwardly facing tape segment 20) as the adhesive layer 62 will retain the solder balls within the blind recesses. Once the die 10 and tape 20 are coupled, a solder ball 16 is located in contact with or in close proximity to each bond pad 18 as shown in FIG. 8D. The dimensions of the recesses 22 and the bond pads 18 may be such that the solder balls and the bond pads 18 contact. Alternatively, a clearance may exist therebetween. In the case of contact, the tape segment 20 may deform to permit contact between the first adhesive surface 21' and the die 10.

To ensure that the die 10 is secured to the tape segment 20, a slight compressive force 72 may be applied to the tape segment and the die as indicated by the arrow 72 in FIG. 8D. Alternatively, the adhesive 23 may be temperature activated. In the case of the latter, the adhesive 23 may be a resin that laminates at a temperature below the solder reflow temperature but does not soften or delaminate during the subsequent reflow process.

Once the tape segment 20 is secured to the die 10, the solder balls 16 are securely held in place (either in contact or in close proximity to the bond pads 18). If desired, the dies (with the tape attached) may be separated from the film 19 along the shear slots 32 and the shear lines 34. The die 10 and the tape segment 20 with the solder balls sandwiched therebetween may then remain secured as a pre-assembled BGA assembly until subsequent reflow.

Figure 8E:
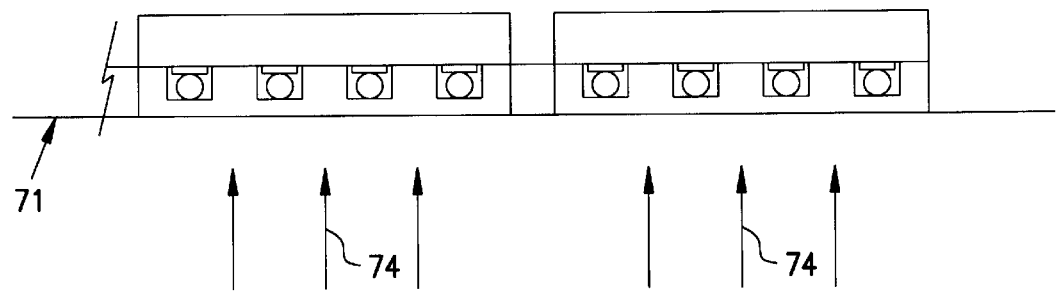

The combined tape and die may be subjected to heat 74 sufficient to reflow the solder balls 16 as shown in FIG. 8E. As previously stated, the tape segment 20 and the adhesives 23 and 62 are adapted to remain thermally stable during reflow.

As the solder reflows, the balls 16 bond to the bond pads 18. Due to the surface tension of the liquid solder, the spherical shape of the balls remains intact during reflow and the solder attempts to center itself on the bond pad 18. Depending on the proximity of the solder balls to the bond pads, the time and temperature of the reflow cycle may be varied to ensure adequate bonding.

Figure 8F:
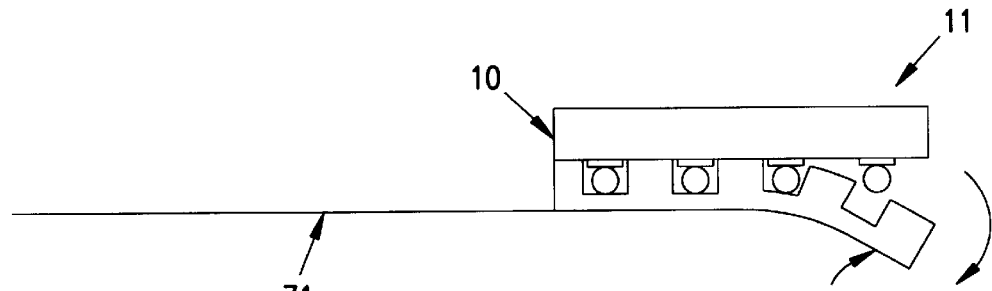

After cooling, the tape segment 20 may be removed from the die 10 as shown in FIG. 8F. Since the bond strength of the solder balls 16 to the pads 18 is greater than the bond strength of the ball to the adhesive 62, the balls remain with the die as the tape is removed. Accordingly, the BGA assembly 11 is formed having the desired BGA formed thereon.

Advantageously, the present invention provides an efficient and reliable tape for producing BGA assemblies in high volume. By patterning the tape to match the specific array of bond pads, the present invention also provides an accurate method of placing a plurality of solder balls relative to a semiconductor device to form most any BGA configuration including fine pitch grids. Furthermore, the tape and method described herein avoid the problems of stencil/solder paste and other current placement techniques. The tape also provides a convenient way to secure the solder balls to the tape and the tape to the semiconductor device.

Exemplary embodiments of the present invention are described above. Those skilled in the art will recognize that many embodiments are possible within the scope of the invention. Variations and modifications of the various parts and assemblies can certainly be made and still fall within the scope of the invention. Thus, the invention is limited only by the following claims, and equivalents thereto.

What is claimed is:

1. A heat-resistant tape comprising a first side forming a first adhesive surface, wherein a plurality of blind recesses are formed on the first side, each blind recess having a second adhesive surface adapted to retain a solder ball within the blind recess, and wherein a perforated removable liner covers the first adhesive surface.

2. A heat-resistant tape comprising a first side forming a first adhesive surface, wherein a plurality of blind recesses are formed on the first side, each blind recess having a second adhesive surface adapted to retain a solder ball within the blind recess wherein a removable liner covers the first adhesive surface, the removable liner having perforations in alignment with the blind recesses.

3. The heat-resistant tape of claim 2 wherein the tape comprises a non-wettable material.

4. The heat-resistant tape of claim 2 wherein the tape comprises a polyimide material.

5. A heat-resistant tape comprising a first side forming a first adhesive surface, wherein a plurality of blind recesses are formed on the first side, each blind recess having a second adhesive surface adapted to retain a solder ball within the blind recess wherein each blind recess is of sufficient depth that the solder ball does not protrude therefrom, and wherein a perforated removable liner covers the first adhesive surface.

6. A heat-resistant tape comprising a first side forming a first adhesive surface, wherein a plurality of blind recesses are formed on the first side, each blind recess having a second adhesive surface adapted to retain a solder ball within the blind recess wherein the tape comprises a silicon material.

7. A heat-resistant tape comprising a first side forming a first adhesive surface, the first side having a plurality of blind recesses adapted to receive a solder ball, each blind recess including one or more interior surfaces, wherein one or more interior surfaces defines a second adhesive surface adapted to securely retain the solder ball within the blind recess, the solder ball retained such that it does not extend beyond the first side, and wherein a perforated removable liner covers the first adhesive surface.

8. A heat-resistant tape comprising a first side forming a first adhesive surface, the first side having a plurality of blind recesses adapted to receive a solder ball, each blind recess including one or more interior surfaces, wherein one or more interior surfaces defines a second adhesive surface adapted to securely retain the solder ball within the blind recess, the solder ball retained such that it does not extend beyond the first side wherein the first adhesive surface is covered by a removable liner having perforations aligned with the plurality of blind recesses.

9. The heat-resistant tape of claim 8 wherein the tape comprises a single layer.

10. The heat-resistant tape of claim 8 wherein the tape comprises multiple layers.

11. The heat-resistant tape of claim 8 wherein the interior surfaces comprise at least one side surface and at least one blind surface.

12. A heat-resistant tape comprising a first side forming a first adhesive surface, the first side having a plurality of blind recesses thereon, each blind recess having a second adhesive surface adapted to retain a solder ball therein, wherein the first adhesive surface is covered by a removable liner having perforations aligned with the plurality of blind recesses.

13. The heat-resistant tape of claim 12, wherein the solder ball does not extend beyond the first side.

14. The heat-resistant tape of claim 12, wherein, upon removal of the liner, the first adhesive surface is adapted to adhere to the first side of a semiconductor device.

15. A heat-resistant tape comprising:
a first side, the first side having a first adhesive surface adapted to adhere to the face of an electronic component;
a plurality of blind recesses located on the first side, each blind recess adapted to receive a solder ball where the solder ball does not extend beyond the first side, each blind recess having a second adhesive surface adapted to retain the solder ball within the blind recess; and
a perforated removable liner covering the first adhesive surface.

16. A heat-resistant tape comprising:
a first side, the first side having a first adhesive surface adapted to adhere to the face of an electronic component;
a plurality of blind recesses located on the first side, each blind recess adapted to receive a solder ball where the solder ball does not extend beyond the first side, each blind recess having a second adhesive surface adapted to retain the solder ball within the blind recess; and
a removable liner covering the first adhesive surface, the liner having a plurality of perforations aligned with the blind recesses to provide access to the blind recesses when the liner is in place.

17. The heat-resistant tape of claim 16 wherein each of the plurality of blind recesses comprises one or more interior surfaces.

18. The heat-resistant tape of claim 17 wherein the second adhesive surface is formed on one or more of the interior surfaces.

19. The heat-resistant tape of claim 16 wherein the first adhesive surface is adapted to resist delamination at a solder reflow temperature.

20. The heat-resistant tape of claim 16 wherein the electronic component comprises a printed circuit board.

21. The heat-resistant tape of claim 16 wherein the electronic component comprises a integrated circuit.

22. The heat-resistant tape of claim 16 wherein the electronic component comprises a semiconductor die.

23. A heat-resistant tape for securing a plurality of solder balls to a semiconductor device, the tape comprising:
a first layer having a first side, a second side, and a plurality of perforations therebetween;
a second layer having a first side, the first side of the second layer being laminated to the second side of the first layer such that the plurality of perforations form a plurality of blind recesses each adapted to receive and retain a solder ball therein.

24. The heat-resistant tape of claim 23 wherein the first side of the first layer forms a first adhesive surface adapted to adhere to the semiconductor device.

25. The heat-resistant tape of claim 24 further comprising a removable liner covering the first adhesive surface, the removable liner protecting the first adhesive surface prior to bonding with the semiconductor device.

26. The heat-resistant tape of claim 23 wherein the first side of the second layer forms a second adhesive surface adapted to adhere to the first layer.

27. The heat-resistant tape of claim 26 wherein a portion of the second adhesive surface forms a blind surface within each blind recess after lamination of the first and second layers, the blind surface adapted to adhere to the solder ball.

28. The heat resistant tape of claim 23 wherein the tape is formed as a sheet adapted to receive multiple semiconductor devices.

29. The heat resistant tape of claim 28 wherein the sheet may be separated into individual tape segments.

30. A pre-assembled BGA assembly comprising:
a semiconductor device having a face defining a series of electrical connection points;
a tape segment having first layer and a second layer, a first side of the first layer being secured to the face of the semiconductor device, the first side of the tape segment comprising a plurality of opening and the second layer being attached to a second side of the first layer such that the openings become a plurality of blind recesses generally aligned with the series of electrical connection points; and
a solder ball located within each blind recess in close proximity to the electrical connection point.

31. The pre-assembled BGA assembly of claim 30 wherein the first side of the tape segment further comprises a first adhesive surface wherein the first adhesive surface secures the first side of the tape segment to the face of the semiconductor device.

32. A pre-assembled BGA assembly comprising:
a semiconductor device having a face defining a series of electrical connection points;
a tape segment having a first side secured to the face of the semiconductor device, the first side of the tape segment comprising a plurality of blind recesses generally aligned with the series of electrical connection points;
a solder ball located within each blind recess in close proximity to the electrical connection point; and
wherein the blind recesses further comprise one or more side surfaces and one or more blind surfaces.

33. A pre-assembled BGA assembly comprising:
a semiconductor device having a face defining a series of electrical connection points;
a tape segment having a first side secured to the face of the semiconductor device, the first side of the tape segment comprising a plurality of blind recesses generally aligned with the series of electrical connection points;
a solder ball located within each blind recess in close proximity to the electrical connection point;
wherein the first side of the tape segment further comprises a first adhesive surface wherein the first adhesive surface secures the first side of the tape segment to the face of the semiconductor device;
wherein the blind recesses further comprise one or more side surfaces and one or more blind surfaces; and
a second adhesive surface formed on one or more of the side surfaces and the blind surface.

34. The pre-assembled BGA assembly of claim 33 wherein the tape segment, the first adhesive surface, and the second adhesive surface are adapted to remain thermally stable during reflow of the solder balls.

35. A pre-assembled BGA assembly comprising:
a semiconductor die having a face including a series of bond pads;
a tape segment having a first layer secured to the face of the semiconductor die, a first side of the tape segment comprising a plurality of openings generally aligned with the series of bond pads and the tape segment having a second layer secured to a second side of the first layer covering the openings to form blind recesses in the tape segment; and
a solder ball located within each blind recess in close proximity to the bond pads.

36. The pre-assembled BGA assembly of claim 35 wherein the first side of the tape segment further comprises a first adhesive coating, wherein the first adhesive coating secures the first side of the tape segment to the face of the semiconductor die.

37. A pre-assembled BGA assembly comprising:
a semiconductor die having a face including a series of bond pads;
a tape segment having a first side secured to the face of the semiconductor die, the first side of the tape segment comprising a plurality of blind recesses generally aligned with the series of bond pads;
a solder ball located within each blind recess in close proximity to the bond pads; and
wherein each blind recess further comprises four generally planar side surfaces and one generally planar blind surface, the blind surface being generally perpendicular to the side surfaces.

38. The pre-assembled BGA assembly of claim 37 wherein each blind surface further comprises a second adhesive coating adapted to retain the solder ball within the blind recess.

39. The pre-assembled BGA assembly of claim 38 wherein the tape segment, the first adhesive coating, and the second adhesive coating are adapted to remain thermally stable during reflow of the solder balls.

40. A pre-assembled BGA assembly comprising:
a semiconductor die having a face including a series of bond pads;
a tape segment having a first side secured to the face of the semiconductor die, the first side of the tape segment comprising a plurality of blind recesses generally aligned with the series of bond pads, each blind recess comprising four generally planar side surfaces and one generally planar blind surface, the blind surface being generally perpendicular to the side surfaces, wherein the first side of the tape segment further comprises a first adhesive coating to secure the first side of the tape segment to the face of the semiconductor die; and
a solder ball located within each blind recess in close proximity to the bond pads wherein the blind surfaces further comprise a second adhesive coating to retain the solder balls within the blind recesses.

41. The pre-assembled BGA assembly of claim 40 wherein the tape segment comprises a polyimide material.

42. The pre-assembled BGA assembly of claim 40 wherein the tape segment comprises a single layer.

43. The pre-assembled BGA assembly of claim 40 wherein the tape segment comprises multiple layers.

* * * * *